(12) United States Patent
Lue et al.

(10) Patent No.: US 11,934,480 B2
(45) Date of Patent: Mar. 19, 2024

(54) NAND BLOCK ARCHITECTURE FOR IN-MEMORY MULTIPLY-AND-ACCUMULATE OPERATIONS

(71) Applicant: MACRONIX INTERNATIONAL CO., LTD., Hsinchu (TW)

(72) Inventors: Hang-Ting Lue, Hsinchu (TW); Hung-Sheng Chang, Taipei (TW); Yi-Ching Liu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 945 days.

(21) Appl. No.: 16/508,189

(22) Filed: Jul. 10, 2019

(65) Prior Publication Data
US 2020/0192971 A1    Jun. 18, 2020

Related U.S. Application Data

(60) Provisional application No. 62/791,037, filed on Jan. 11, 2019, provisional application No. 62/780,938, filed on Dec. 18, 2018.

(51) Int. Cl.
*G06F 17/00*      (2019.01)
*G06F 17/16*      (2006.01)
(Continued)

(52) U.S. Cl.
CPC .......... *G06F 17/16* (2013.01); *G11C 16/0483* (2013.01); *G11C 16/08* (2013.01);
(Continued)

(58) Field of Classification Search
CPC ............. G06F 17/16; G06F 2207/4824; G11C 16/0483; G11C 16/08; G11C 16/10; G11C 16/24; G11C 16/26
See application file for complete search history.

(56) References Cited

U.S. PATENT DOCUMENTS

| 4,219,829 A | 8/1980 | Dorda et al. |
| 4,987,090 A | 1/1991 | Hsu et al. |

(Continued)

FOREIGN PATENT DOCUMENTS

| CN | 101432821 A | 5/2009 |
| CN | 1998012 B | 11/2010 |

(Continued)

OTHER PUBLICATIONS

JP Office Action in Application No. JP 2019-166959 dated Nov. 16, 2021 with English Machine Translation, 9 pages.

(Continued)

*Primary Examiner* — Uyen Smet

(74) *Attorney, Agent, or Firm* — Franklin M. Schellenberg; Haynes Beffel & Wolfeld LLP

(57) ABSTRACT

A circuit for in-memory multiply-and-accumulate functions includes a plurality of NAND blocks. A NAND block includes an array of NAND strings, including B columns and S rows, and L levels of memory cells. W word lines are coupled to (B*S) memory cells in respective levels in the L levels. A source line is coupled to the (B*S) NAND strings in the block. String select line drivers supply voltages to connect NAND strings on multiple string select lines to corresponding bit lines simultaneously. Word line drivers are coupled to apply word line voltages to a word line or word lines in a selected level. A plurality of bit line drivers apply input data to the B bit lines simultaneously. A current sensing circuit is coupled to the source line.

22 Claims, 8 Drawing Sheets

(51) Int. Cl.
  *G11C 16/04* (2006.01)
  *G11C 16/08* (2006.01)
  *G11C 16/10* (2006.01)
  *G11C 16/24* (2006.01)
  *G11C 16/26* (2006.01)

(52) U.S. Cl.
  CPC .............. *G11C 16/10* (2013.01); *G11C 16/24* (2013.01); *G11C 16/26* (2013.01)

(56) References Cited

U.S. PATENT DOCUMENTS

| | | |
|---|---|---|
| 5,029,130 A | 7/1991 | Yeh |
| 5,586,073 A | 12/1996 | Hiura et al. |
| 6,107,882 A | 8/2000 | Gabara et al. |
| 6,313,486 B1 | 11/2001 | Kencke et al. |
| 6,829,598 B2 | 12/2004 | Milev |
| 6,856,542 B2 * | 2/2005 | Roy ....................... H10B 69/00 |
| | | 257/E27.103 |
| 6,906,940 B1 | 6/2005 | Lue |
| 6,960,499 B2 | 11/2005 | Nandakumar et al. |
| 7,089,218 B1 | 8/2006 | Visel |
| 7,368,358 B2 | 5/2008 | Ouyang et al. |
| 7,436,723 B2 | 10/2008 | Rinerson et al. |
| 7,747,668 B2 | 6/2010 | Nomura et al. |
| 8,203,187 B2 | 6/2012 | Lung et al. |
| 8,275,728 B2 | 9/2012 | Pino |
| 8,432,719 B2 | 4/2013 | Lue |
| 8,589,320 B2 | 11/2013 | Breitwisch et al. |
| 8,630,114 B2 | 1/2014 | Lue |
| 8,725,670 B2 | 5/2014 | Visel |
| 8,860,124 B2 | 10/2014 | Lue et al. |
| 9,064,903 B2 | 6/2015 | Mitchell et al. |
| 9,147,468 B1 | 9/2015 | Lue |
| 9,213,936 B2 | 12/2015 | Visel |
| 9,379,129 B1 | 6/2016 | Lue et al. |
| 9,391,084 B2 | 7/2016 | Lue |
| 9,430,735 B1 | 8/2016 | Vali et al. |
| 9,431,099 B2 | 8/2016 | Lee et al. |
| 9,524,980 B2 | 12/2016 | Lue |
| 9,535,831 B2 | 1/2017 | Jayasena et al. |
| 9,536,969 B2 | 1/2017 | Yang et al. |
| 9,589,982 B1 | 3/2017 | Cheng et al. |
| 9,698,156 B2 | 7/2017 | Lue |
| 9,698,185 B2 | 7/2017 | Chen et al. |
| 9,710,747 B2 | 7/2017 | Kang et al. |
| 9,747,230 B2 | 8/2017 | Han et al. |
| 9,754,953 B2 | 9/2017 | Tang et al. |
| 9,767,028 B2 | 9/2017 | Cheng et al. |
| 9,898,207 B2 | 2/2018 | Kim et al. |
| 9,910,605 B2 | 3/2018 | Jayasena et al. |
| 9,978,454 B2 | 5/2018 | Jung |
| 9,983,829 B2 | 5/2018 | Ravimohan et al. |
| 9,991,007 B2 | 6/2018 | Lee et al. |
| 10,037,167 B2 | 7/2018 | Kwon et al. |
| 10,056,149 B2 | 8/2018 | Yamada et al. |
| 10,073,733 B1 | 9/2018 | Jain et al. |
| 10,157,012 B2 | 12/2018 | Kelner et al. |
| 10,175,667 B2 | 1/2019 | Bang et al. |
| 10,242,737 B1 | 3/2019 | Lin et al. |
| 10,528,643 B1 | 1/2020 | Choi et al. |
| 10,534,840 B1 | 1/2020 | Petti |
| 10,565,494 B2 | 1/2020 | Henry et al. |
| 10,635,398 B2 | 4/2020 | Lin et al. |
| 10,643,713 B1 | 5/2020 | Louie et al. |
| 10,719,296 B2 | 7/2020 | Lee et al. |
| 10,777,566 B2 | 9/2020 | Lue |
| 10,783,963 B1 | 9/2020 | Hung et al. |
| 10,790,828 B1 * | 9/2020 | Gunter ............... H03K 19/1774 |
| 10,825,510 B2 | 11/2020 | Jaiswal et al. |
| 10,860,682 B2 | 12/2020 | Knag et al. |
| 10,942,673 B2 | 3/2021 | Shafiee Ardestani et al. |
| 10,957,392 B2 | 3/2021 | Lee et al. |
| 11,410,028 B2 | 8/2022 | Crill et al. |
| 2003/0122181 A1 | 7/2003 | Wu |
| 2005/0088878 A1 * | 4/2005 | Eshel ..................... G11C 16/28 |
| | | 365/185.28 |
| 2005/0287793 A1 | 12/2005 | Blanchet et al. |
| 2010/0172189 A1 * | 7/2010 | Itagaki ............... G11C 16/0483 |
| | | 365/185.29 |
| 2010/0182828 A1 | 7/2010 | Shima et al. |
| 2010/0202208 A1 | 8/2010 | Endo et al. |
| 2011/0063915 A1 | 3/2011 | Tanaka et al. |
| 2011/0106742 A1 | 5/2011 | Pino |
| 2011/0128791 A1 | 6/2011 | Chang et al. |
| 2011/0194357 A1 | 8/2011 | Han et al. |
| 2011/0286258 A1 | 11/2011 | Chen et al. |
| 2011/0297912 A1 | 12/2011 | Samachisa et al. |
| 2012/0007167 A1 | 1/2012 | Hung et al. |
| 2012/0044742 A1 | 2/2012 | Narayanan |
| 2012/0182801 A1 | 7/2012 | Lue |
| 2012/0235111 A1 | 9/2012 | Osano et al. |
| 2012/0254087 A1 | 10/2012 | Visel |
| 2013/0070528 A1 | 3/2013 | Maeda |
| 2013/0075684 A1 | 3/2013 | Kinoshita et al. |
| 2014/0043898 A1 * | 2/2014 | Kuo ..................... G11C 11/5628 |
| | | 365/185.12 |
| 2014/0063949 A1 | 3/2014 | Tokiwa |
| 2014/0119127 A1 | 5/2014 | Lung et al. |
| 2014/0149773 A1 | 5/2014 | Huang et al. |
| 2014/0268996 A1 | 9/2014 | Park |
| 2014/0330762 A1 | 11/2014 | Visel |
| 2015/0008500 A1 | 1/2015 | Fukumoto et al. |
| 2015/0171106 A1 | 6/2015 | Suh |
| 2015/0199126 A1 | 7/2015 | Jayasena et al. |
| 2015/0331817 A1 | 11/2015 | Han et al. |
| 2016/0141337 A1 | 5/2016 | Shimabukuro et al. |
| 2016/0181315 A1 | 6/2016 | Lee et al. |
| 2016/0232973 A1 | 8/2016 | Jung |
| 2016/0247579 A1 | 8/2016 | Ueda et al. |
| 2016/0308114 A1 | 10/2016 | Kim et al. |
| 2016/0336064 A1 | 11/2016 | Seo et al. |
| 2016/0342892 A1 | 11/2016 | Ross |
| 2016/0342893 A1 | 11/2016 | Ross et al. |
| 2016/0358661 A1 * | 12/2016 | Vali ..................... G06N 3/063 |
| 2017/0003889 A1 | 1/2017 | Kim et al. |
| 2017/0025421 A1 | 1/2017 | Sakakibara et al. |
| 2017/0092370 A1 | 3/2017 | Harari |
| 2017/0103316 A1 | 4/2017 | Ross et al. |
| 2017/0123987 A1 | 5/2017 | Cheng et al. |
| 2017/0148517 A1 | 5/2017 | Harari |
| 2017/0160955 A1 | 6/2017 | Jayasena et al. |
| 2017/0169885 A1 | 6/2017 | Tang et al. |
| 2017/0169887 A1 | 6/2017 | Widjaja |
| 2017/0263623 A1 | 9/2017 | Zhang et al. |
| 2017/0270405 A1 | 9/2017 | Kurokawa |
| 2017/0309634 A1 | 10/2017 | Noguchi et al. |
| 2017/0316833 A1 | 11/2017 | Ihm et al. |
| 2017/0317096 A1 | 11/2017 | Shin et al. |
| 2017/0337466 A1 | 11/2017 | Bayat et al. |
| 2018/0113649 A1 | 4/2018 | Shafiee Ardestani et al. |
| 2018/0121790 A1 | 5/2018 | Kim et al. |
| 2018/0129424 A1 | 5/2018 | Confalonieri et al. |
| 2018/0129936 A1 | 5/2018 | Young et al. |
| 2018/0144240 A1 | 5/2018 | Garbin et al. |
| 2018/0157488 A1 | 6/2018 | Shu et al. |
| 2018/0173420 A1 | 6/2018 | Li et al. |
| 2018/0189640 A1 | 7/2018 | Henry et al. |
| 2018/0240522 A1 | 8/2018 | Jung |
| 2018/0246783 A1 | 8/2018 | Avraham et al. |
| 2018/0247195 A1 | 8/2018 | Kumar et al. |
| 2018/0286874 A1 | 10/2018 | Kim et al. |
| 2018/0321942 A1 | 11/2018 | Yu et al. |
| 2018/0342299 A1 | 11/2018 | Yamada et al. |
| 2018/0350823 A1 | 12/2018 | Or-Bach et al. |
| 2019/0019538 A1 * | 1/2019 | Li .......................... G11C 8/08 |
| 2019/0019564 A1 | 1/2019 | Li et al. |
| 2019/0035449 A1 | 1/2019 | Saida et al. |
| 2019/0043560 A1 | 2/2019 | Sumbul et al. |
| 2019/0065151 A1 | 2/2019 | Chen et al. |
| 2019/0088329 A1 | 3/2019 | Tiwari et al. |
| 2019/0102170 A1 | 4/2019 | Chen et al. |
| 2019/0138892 A1 | 5/2019 | Kim et al. |
| 2019/0148393 A1 | 5/2019 | Lue |

(56) References Cited

U.S. PATENT DOCUMENTS

| | | | |
|---|---|---|---|
| 2019/0164044 A1 | 5/2019 | Song et al. |
| 2019/0164617 A1 | 5/2019 | Tran et al. |
| 2019/0213234 A1 | 7/2019 | Bayat et al. |
| 2019/0220249 A1 | 7/2019 | Lee et al. |
| 2019/0244662 A1 | 8/2019 | Lee et al. |
| 2019/0286419 A1 | 9/2019 | Lin et al. |
| 2019/0311243 A1 | 10/2019 | Whatmough et al. |
| 2019/0311749 A1 | 10/2019 | Song et al. |
| 2019/0325959 A1 | 10/2019 | Bhargava et al. |
| 2019/0340497 A1 | 11/2019 | Baraniuk et al. |
| 2019/0363131 A1 | 11/2019 | Torng et al. |
| 2020/0026993 A1 | 1/2020 | Otsuka |
| 2020/0065650 A1 | 2/2020 | Tran et al. |
| 2020/0110990 A1 | 4/2020 | Harada et al. |
| 2020/0117986 A1 | 4/2020 | Burr et al. |
| 2020/0118638 A1 | 4/2020 | Leobandung et al. |
| 2020/0160165 A1 | 5/2020 | Sarin |
| 2020/0334015 A1 | 10/2020 | Shibata et al. |
| 2021/0240945 A1 | 8/2021 | Strachan et al. |

FOREIGN PATENT DOCUMENTS

| | | | |
|---|---|---|---|
| CN | 103778468 A | 5/2014 |
| CN | 105718994 A | 6/2016 |
| CN | 105789139 A | 7/2016 |
| CN | 106530210 A | 3/2017 |
| CN | 107077879 A | 8/2017 |
| CN | 107533459 A | 1/2018 |
| CN | 107767905 A | 3/2018 |
| CN | 108268946 A | 7/2018 |
| EP | 2048709 A2 | 4/2009 |
| JP | H0451382 A | 2/1992 |
| JP | 2006127623 A | 5/2006 |
| JP | 2009080892 A | 4/2009 |
| TW | 201108230 A | 3/2011 |
| TW | 201523838 A | 6/2015 |
| TW | 201618284 A | 5/2016 |
| TW | 201639206 A | 11/2016 |
| TW | 201715525 A | 5/2017 |
| TW | 201732824 A | 9/2017 |
| TW | 201741943 A | 12/2017 |
| TW | 201802800 A | 1/2018 |
| TW | 201822203 A | 6/2018 |
| WO | 2012009179 A1 | 1/2012 |
| WO | 2012015450 A1 | 2/2012 |
| WO | 2016060617 A1 | 4/2016 |
| WO | 2017091338 A1 | 6/2017 |
| WO | 2018201060 A1 | 11/2018 |

OTHER PUBLICATIONS

EP Extended Search Report from 18155279.5-1203 dated Aug. 30, 2018, 8 pages.

EP Extended Search Report from EP18158099.4 dated Sep. 19, 2018, 8 pages.

Jang et al., "Vertical cell array using TCAT(Terabit Cell Array Transistor) technology for ultra high density NAND flash memory," 2009 Symposium on VLSI Technology, Honolulu, HI, Jun. 16-18, 2009, pp. 192-193.

Kim et al. "Multi-Layered Vertical Gate NAND Flash Overcoming Stacking Limit for Terabit Density Storage," 2009 Symposium on VLSI Technology Digest of Papers, Jun. 16-18, 2009, 2 pages.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187.

Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.

Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.

Sakai et al., "A Buried Giga-Ohm Resistor (BGR) Load Static RAM Cell," IEEE Symp. on VLSI Technology, Digest of Papers, Sep. 10-12, 1984, 2 pages.

Schuller et al., "Neuromorphic Computing: From Materials to Systems Architecture," US Dept. of Energy, Oct. 29-30, 2015, Gaithersburg, MD, 40 pages.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.

Soudry, et al. "Hebbian learning rules with memristors," Center for Communication and Information Technologies CCIT Report #840, Sep. 1, 2013, 16 pages.

Tanaka H., et al., "Bit Cost Scalable Technology with Punch and Plug Process for Ultra High Density Flash Memory," 2007 Symp. VLSI Tech., Digest of Tech. Papers, pp. 14-15.

U.S. Office Action in U.S. Appl. No. 15/887,166 dated Jul. 10, 2019, 18 pages.

U.S. Office Action in U.S. Appl. No. 15/887,166 dated Jan. 30, 2019, 18 pages.

U.S. Office Action in U.S. Appl. No. 15/922,359 dated Jun. 24, 2019, 8 pages.

U.S. Office Action in U.S. Appl. No. 16/233,404 dated Oct. 31, 2019, 22 pages.

U.S. Office Action in related case U.S. Appl. No. 15/873,369 dated May 9, 2019, 8 pages.

Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.

Aritome, et al., "Reliability issues of flash memory cells," Proc. of the IEEE, vol. 81, No. 5, May 1993, pp. 776-788.

Guo et al., "Fast, energy-efficient, robust, and reproducible mixed-signal neuromorphic classifier based on embedded NOR flash memory technology," IEEE Int'l Electron Devices Mtg., San Francisco, CA, Dec. 2-6, 2017, 4 pages.

Merrikh-Bayat et al., "High-Performance Mixed-Signal Neurocomputing with Nanoscale Flowting-Gate Memory Cell Arrays," in IEEE Transactions on Neural Netowrks and Learning Systems, vol. 29, No. 10, Oct. 2018, pp. 4782-4790.

U.S. Office Action in U.S. Appl. No. 16/224,602 dated Nov. 23, 2020, 14 pages.

U.S. Office Action in U.S. Appl. No. 16/279,494 dated Nov. 12, 2020, 25 pages.

U.S. Office Action in U.S. Appl. No. 16/359,919 dated Oct. 16, 2020, 13 pages.

Webopedia, "SoC", Oct. 5, 2011, pp. 1-2, https://web.archive.org/web/20111005173630/https://www.webopedia.com/ TERM/S/SoC.html (Year: 2011)—See Office Action dated Aug. 17, 2020 in U.S. Appl. No. 16/279,494 for relevance—no month provided by examiner.

U.S. Office Action in U.S. Appl. No. 16/233,414 dated Apr. 20, 2020, 17 pages.

Chen et al., "Eyeriss: An Energy-Efficient reconfigurable accelerator for deep convolutional neural networks," IEEE ISSCC, Jan. 31-Feb. 4, 2016, 3 pages.

EP Extended Search Report from EP19193290.4 dated Feb. 14, 2020, 10 pages.

Gonugondla et al., "Energy-Efficient Deep In-memory Architecture for NAND Flash Memories," IEEE International Symposium on Circuits and Systems (ISCAS), May 27-30, 2018, 5 pages.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

TW Office Action from TW Application No. 10820980430, dated Oct. 16, 2019, 6 pages (with English Translation).

(56) References Cited

OTHER PUBLICATIONS

U.S. Office Action in U.S. Appl. No. 15/873,369 dated Dec. 4, 2019, 5 pages.
U.S. Office Action in U.S. Appl. No. 15/922,359 dated Oct. 11, 2019, 7 pages.
U.S. Office Action in related case U.S. Appl. No. 16/037,281 dated Dec. 19, 2019, 9 pages.
U.S. Office Action in related case U.S. Appl. No. 16/297,504 dated Feb. 4, 2020, 15 pages.
Wang et al., "Three-Dimensional NAND Flash for Vector-Matrix Multiplication," IEEE Trans. on Very Large Scale Integration Systems (VLSI), vol. 27, No. 4, Apr. 2019, 4 pages.
Anonymous, "Data In The Computer", May 11, 2015, pp. 1-8, https://web.archive.org/web/20150511143158/https:// homepage.cs.uri.edu/faculty/wolfe/book/Readings/Reading02.htm (Year: 2015)—See Office Action dated Aug. 17, 2020 in U.S. Appl. No. 16/279,494 for relevance—no year provided by examiner.
Rod Nussbaumer, "How is data transmitted through wires in the computer?", Aug. 27, 2015, pp. 1-3, https://www.quora.com/ How-is-data-transmitted-through-wires-in-the-computer (Year: 2015)—See Office Action dated Aug. 17, 2020 in U.S. Appl. No. 16/279,494 for relevance—no year provided by examiner.
Scott Thornton, "What is DRAm (Dynamic Random Access Memory) vs SRAM?", Jun. 22, 2017, pp. 1-11, https://www.microcontrollertips.com/dram-vs-sram/ (Year: 2017)—See Office Action dated Aug. 17, 2020 in U.S. Appl. No. 16/279,494 for relevance—no year provided by examiner.
TW Office Action from TW Application No. 10920683760, dated Jul. 20, 2020, 4 pages.
U.S. Office Action in U.S. Appl. No. 16/233,404 dated Jul. 30, 2020, 20 pages.
U.S. Office Action in U.S. Appl. No. 16/279,494 dated Aug. 17, 2020, 25 pages.
Webopedia, "DRAM—dynamic random access memory", Jan. 21, 2017, pp. 1-3, https://web.archive.org/web/20170121124008/https://www.webopedia.com/TERM/D/DRAM.html (Year: 2017)—See Office Action dated Aug. 17, 2020 in U.S. Appl. No. 16/279,494 for relevance—no year provided by examiner.
Webopedia, "volatile memory", Oct. 9, 2017, pp. 1-4, https://web.archive.org/web/20171009201852/https://www.webopedia.com/TERMN/volatile_memory.html (Year: 2017)—See Office Action dated Aug. 17, 2020 in U.S. Appl. No. 16/279,494 for relevance—no year provided by examiner.
Chen et al., "A Highly Pitch Scalable 3D Vertical Gate (VG) NAND Flash Decoded by a Novel Self-Aligned Independently Controlled Double Gate (IDG) StringSelect Transistor (SSL)," 2012 Symp. on VLSI Technology (VLSIT), Jun. 12-14, 2012, pp. 91-92.
Choi et al., "Performance Breakthrough in NOR Flash Memory With Dopant-Segregated Schottky-Barrier (DSSB) SONOS Devices," Jun. 2009 Symposium on VLSITechnology Digest of Technical Papers, pp. 222-223.
Fukuzumi et al. "Optimal Integration and Characteristics of Vertical Array Devices for Ultra-High Density, Bit-Cost Scalable Flash Memory," IEEE Dec. 2007, pp. 449-452.
Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.
Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.
Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.
Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.
Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.
Kim et al., "Three-Dimensional NAND Flash Architecture Design Based on Single-Crystalline STacked ARray," IEEE Transactions on Electron Devices, vol. 59, No. 1, pp. 35-45, Jan. 2012.
Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.
Nowak et al., "Intrinsic fluctuations in Vertical NAND flash memories," 2012 Symposium on VLSI Technology, Digest of Technical Papers, pp. 21-22, Jun. 12-14, 2012.
Tanaka et al., "Bit Cost Scalable Technology with Punch and Plug Process for Ultra High Density Flash Memory," VLSI Technology, 2007 IEEE Symposium on Jun. 12-14, 2007, pp. 14-15.
TW Office Action from TW Application No. 10820907820, dated Sep. 22, 2020, 41 pages.
Wang, Michael, "Technology Trends on 3D-NAND Flash Storage", Impact 2011, Taipei, dated Oct. 20, 2011, found at www.impact.org.tw/2011/Files/NewsFile/201111110190.pdf.
Y.X. Liu et al., "Comparative Study of Tri-Gate and Double-Gate-Type Poly-Si Fin-Channel Spli-Gate Flash Memories," 2012 IEEE Silicon Nanoelectronics Workshop (SNW), Honolulu, HI, Jun. 10-11, 2012, pp. 1-2.
Liu et al., "Parallelizing SRAM Arrays with Customized Bit-Cell for Binary Neural Networks," 55th ACM/ESDA/IEEE Design Automation Conference (DAC), Sep. 20, 2018, 4 pages.
U.S. Office Action in U.S. Appl. No. 16/169,345 dated Aug. 16, 2022, 5 pages.
U.S. Office Action in U.S. Appl. No. 16/224,602 dated Mar. 24, 2021, 17 pages.
U.S. Office Action in U.S. Appl. No. 16/359,919 dated Mar. 3, 2021, 15 pages.
U.S. Office Action in U.S. Appl. No. 16/450,334 dated Aug. 4, 2022, 20 pages.

* cited by examiner

NAND BLOCK ARCHITECTURE FOR IN-MEMORY MULTIPLY-AND-ACCUMULATE OPERATIONS

PRIORITY APPLICATION

This application claims the benefit of U.S. Provisional Patent Application No. 62/791,037, filed 11 Jan. 2019; and also claims benefit of U.S. Provisional Patent Application No. 62/780,938, filed 18 Dec. 2018; which applications are incorporated herein by reference.

BACKGROUND

Field

The present invention relates to circuitry that can be used to perform sum-of-products operations.

Description of Related Art

In neuromorphic computing systems, machine learning systems and circuitry used for some types of computation based on linear algebra, the sum-of-products function can be an important component. The function can be expressed as follows:

$$f(x_i) = \sum_{i=1}^{M} W_i x_i$$

In this expression, each product term is a product of a variable input $X_i$ and a weight $W_i$. The weight $W_i$ can vary among the terms, corresponding for example to coefficients of the variable inputs $X_i$.

The sum-of-products function can be realized as a circuit operation using cross-point array architectures in which the electrical characteristics of cells of the array effectuate the function.

For high-speed implementations, it is desirable to have a very large array so that many operations can be executed in parallel, or very large sum-of-products series can be performed. In some systems, there can be a very large number of inputs and outputs, so that the total current consumption can be large.

Also, artificial intelligence AI functions include large scale matrix multiplication, involving multiply-and-accumulate MAC steps (i.e., sum-of-products) using multi-bit weights, which can require very dense memory, and high bandwidth data communications.

Recent advances in AI hardware have been directed to high performance and low power solutions. To meet these needs, "in-memory computation" or "processor-in-memory" implementations have been proposed. These technologies can reduce data movement requirements to save power and latency.

It is desirable to provide structures for sum-of-products operations suitable for implementation in large arrays, and that can be flexible, high-capacity and energy-efficient.

SUMMARY

Multiply-and-accumulate technology, for sum-of-products operations on a large scale, is described based on in-memory computation using a plurality of NAND blocks. NAND blocks used in examples described herein can be implemented using 3D NAND flash technologies.

Means are described for applying input signals to a multi-member set of bit lines coupled to a NAND block in the plurality of NAND blocks, for connecting sets of NAND strings in the NAND block to respective bit lines in the set of bit lines, and for sensing a sum-of-currents on a source line from the set of bit lines through the respective sets of NAND strings. The conductances (or the reciprocal, resistances) of the sets of NAND strings are determined by the data stored in the memory cells on the NAND strings.

A NAND block in the plurality of NAND blocks, for an embodiment described herein, includes a plurality of NAND strings disposed between bit lines in a multi-member set of bit lines and a source line for the NAND block. The NAND strings have string select switches to selectively connect the NAND strings to corresponding bit lines. The NAND strings include a plurality of memory cells arranged in series between the string select switches and a ground select switch by which the NAND string is connected to a source line. Word lines are coupled to the gates of memory cells in corresponding word line levels of the NAND block. Likewise, string select lines are coupled to the gates of string select switches in corresponding rows of NAND strings.

For a particular NAND block, the multi-member set of bit lines can include B members, and the NAND block can include a set of string select lines having at least S members. In this configuration, the NAND block includes an array of B*S NAND strings, including B columns and S rows of NAND strings. A set of string select drivers are operable in the computation mode to connect S NAND strings (one from each row) in a column of the NAND block to each bit line in the multi-member set of bit lines. In this manner, the computation mode current on the source line is a sum of B product terms, and each product term is a function of an input signal on one of the bit lines in the multi-member set of bit lines times the conductance of the S NAND strings connected to the bit line.

A circuit is described that includes a plurality of NAND blocks, each operable in a computation mode and a memory mode. A bus system connects to the inputs and outputs of the plurality of NAND blocks, whereby input data for a sum-of-products operation can be applied to the NAND blocks, and coefficients for the sum-of-products operation can be stored in the NAND blocks.

The input and output circuits used in computation and memory modes can be shared, and in some cases different circuits can be used for the different modes. The computation mode input of a given NAND block can include a set of bit line drivers to apply input data in parallel to the bit lines of the given NAND block. The computation mode output of the given NAND block can include a multi-bit sense amplifier to sense output data on a source line of the given NAND block. The memory mode input of the given NAND block can comprise a page buffer circuit, which can include the input drivers for the computation mode, or can be a separate circuit.

In other aspects of the technology, a structure of a NAND block suitable for use in a multiply-and-accumulate accelerator is described. Also, in other aspects of the technology, an integrated circuit comprising a plurality of multiply-and-accumulate tiles, where each tile comprises a plurality of NAND blocks as described above.

A method for in-memory computation of a sum-of-products is described, comprising:
 a) storing coefficient data w(i,j) for a product term X(i) *W(i) in cells a level L(k) of a NAND block in a column C(i)

of NAND strings on string select lines SSL(j) coupled to bit line BL(i), for i going from 1 to B, j going from 1 to S and for k equal to a selected word line level;

b) applying inputs X(i) to bit lines BL(1) to BL(B), and string select voltages to string select lines SSL(1) to SSL(S), and a word line compute voltage to cells in the selected word line level (simultaneously or in a combination overlapping in time to bias the cells for sensing);

c) combining currents through the columns C(1) to C(B) of NAND strings connected to bit lines BL(1) to BL(B) on a source line for the NAND block; and d) sensing a current magnitude on the source line to generate an output signal representing the sum-of-products.

An array of NAND blocks arranged as described herein can be operated in a pipeline fashion, supporting high throughput operations, such as useable for inference mode operations of machine learning systems.

Applying technology described herein, a dense and energy-efficient multiply-and-accumulate accelerator is provided. Embodiments can be configured to execute on the order of tera-operations TOPS per watt.

Other aspects and advantages of the present invention can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

As used herein, the term "coupled" means operatively coupled. Items that are coupled in this sense are not necessarily directly connected, and there may be intervening items between the coupled items.

Figure 1:
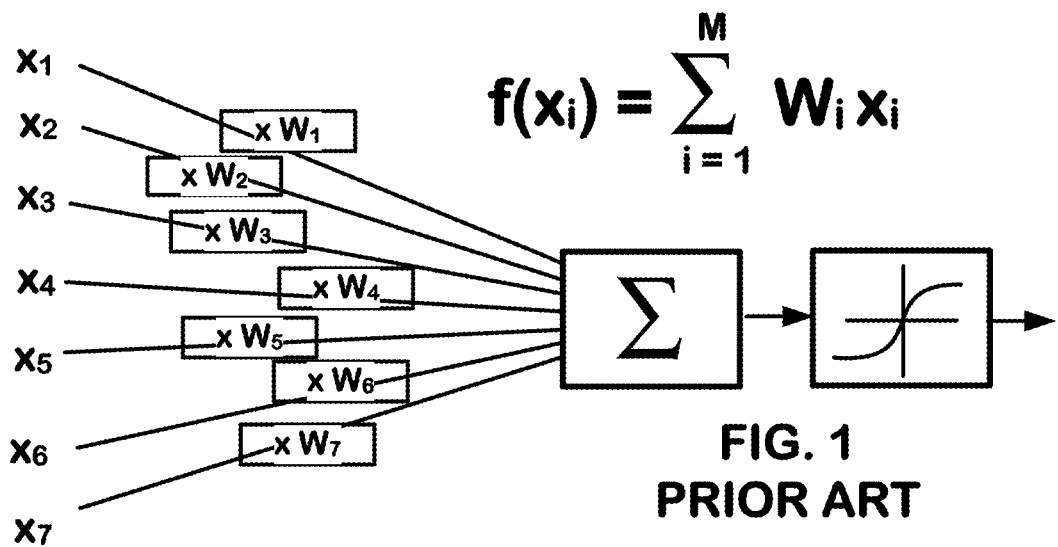
FIG. 1 is a diagram of a sum-of-products operation.

FIG. 1 is a diagram of a sum-of-products operation, where the terms of the summation are the product of input $X_i$ times a weight $W_i$, in this example, where i goes from 1 to 7. The weight $W_i$ can differ over the terms of the summation. In operation, the weights can be assigned as a set of coefficients, and then the inputs applied to compute a summation that changes as the inputs change. Also, in algorithms executing a learning procedure, the weights can be changed from time to time as the learning procedures change coefficients to learn from the summation that achieves a useable result.

In the illustrated example, the output of the summation is applied to a sigmoid function to produce an output that ranges in a non-linear fashion between a minimum and a maximum such as between 0 and 1. Other activation functions can be used as well, such as a logit function, or rectifier functions. The sum-of-products operation can be applied as well in configurations not neuromorphic or not otherwise considered to model neurological systems.

Neural networks, including convolutional neural networks, and other types of neural networks, often comprise logic organized in layers, in which each layer can receive as input the output of a previous layer, possibly subjected to an activation function, and execute hundreds or thousands of sum-of-products operations in parallel, the output of which is applied to a subsequent activation function or other logic unit.

Figure 2:
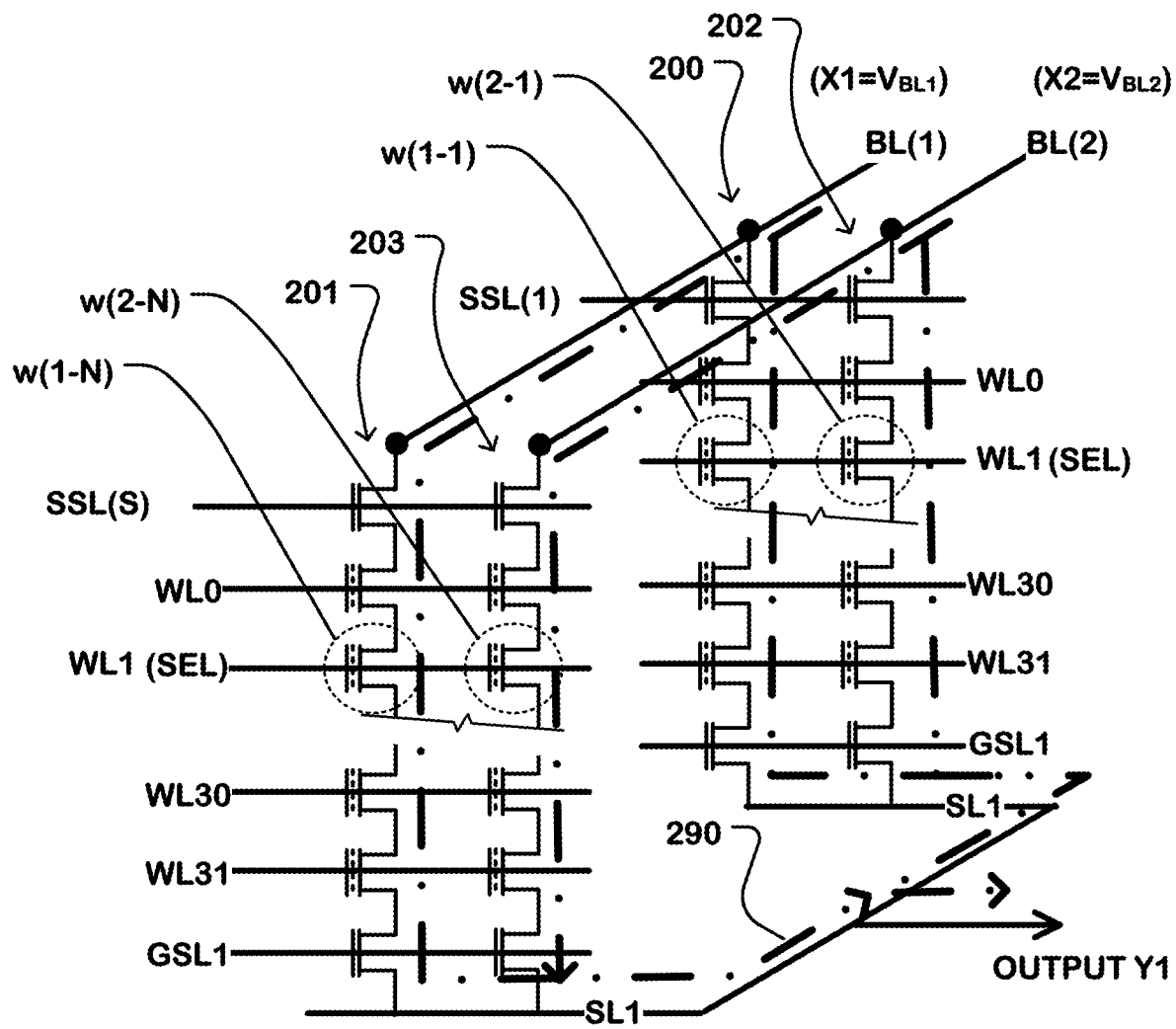
FIG. 2 is a circuit diagram for a NAND block configurable for a memory mode and for a computation mode as described herein.

FIG. 2 is a schematic diagram of a NAND block including an array of vertical NAND strings arranged in rows and columns. A row in a NAND block for the purposes of this description is a set of NAND strings having a common string select line, and common word lines, and each coupled to different bit lines in response to the common string select line, so that they are logically arranged in a row along the common string select line and word lines. A column in a NAND block for the purposes of this description is a set of NAND strings having a common bit line, each coupled to different string select lines, so that they are arranged logically in a column along the common bit line. In physical layout, a column or a row may be twisted, arranged in a honeycomb pattern or otherwise laid out for high density or for other reasons according to the manufacturing method applied. In the diagram, a NAND string 200 and a NAND string 201 in a first column of the array are coupled to a first bit line BL(1) and to a source line SL1 for the block. Also, a NAND string 202 and a NAND string 203 in a second column of the array are coupled to a second bit line BL(2) and to the source line SL1 for the block. In the illustrated example, two bit lines are shown for simplicity of the figure. It is contemplated that a given NAND block can be coupled to many bit lines BL(i), for i going from 1 to B, including tens, hundreds or thousands of bit lines in a given implementation, along with corresponding numbers of columns of NAND strings in the array of NAND strings.

Each of the NAND strings in the array of NAND strings includes a string select switch coupled to a corresponding string select line SSL(1) and SSL(S), which is used to connect and disconnect the corresponding NAND string to its bit line. The NAND string 200 and the NAND string 202 in a first row of the array are coupled to the first string select line SSL(1) for the block. The NAND string 201 and the NAND string 203 and an Sth row of the array are coupled to the Sth string select line SSL(S). In the illustrated example, two string select lines are shown for simplicity of the figure. It is contemplated that a given NAND block can be coupled to many string select lines, in a given implementation, along with corresponding numbers of rows of NAND strings in the array of NAND strings.

Each of the NAND strings in the array of NAND strings includes a ground select switch coupled to a ground select line GSL1 for the block, which is used to connect the corresponding NAND string in the array of NAND strings to the source line SL1 for the block. In some embodiments, the ground select switches on corresponding NAND strings can be controlled by separate ground select lines with appropriate decoding circuitry to support the memory mode and computation mode as described herein.

Each of the NAND strings in the array of NAND strings includes a plurality of memory cells arranged in series between the string select switch and the ground select switch, coupled to corresponding word lines. In this example, all of the word lines in a given level of the NAND block are coupled in common to a single word line conductor, or to separate word line conductors controlled in common by a single word line decoder, such that all, or a selected plurality of, the rows of memory cells in a given level of the NAND block can receive the same word line signal. In this example, the NAND strings of the NAND block are vertical NAND strings including 32 levels of memory cells coupled to 32 word lines WL0-WL31.

In a memory mode of operation, data can be written into the individual memory cells using program and erase operations supported by a page buffer (not shown) coupled to the plurality of bit lines of the block. In the memory mode operations, typically, one of the rows of NAND strings in the array of NAND strings is selected using a selected string select line. In this case, one of the NAND strings in each column of the array of NAND strings is coupled to one of the bit lines. A page buffer can be utilized to program a data pattern into the individual NAND strings in a selected row of the array of NAND strings coupled to a plurality of bit lines in parallel at each level of the NAND block. Also, the page buffer in the memory mode can be utilized to read data stored in the memory cells in a selected row of the array of NAND strings at each level of the NAND block.

In a memory mode, coefficients of a sum-of-products operation can be stored into the NAND block. The NAND cells in the NAND block can be implemented using a single-bit-per-cell technology, or a multiple-bit-per-cell technology. In some embodiments a single-bit-per-cell technology can be preferred as the coefficients are stored in a manner distributed across the plurality of NAND strings as discussed below. In other embodiments, multiple-bit-per-cell technology can be used to provide even greater precision in the programming of the coefficients into the NAND block.

Referring to the illustration in FIG. 1, input signals X1 and X2 can be represented by the voltages VBL(1) and VBL2 applied to the bit lines BL(1) and BL(2). The coefficient W1 can be represented by the conductivity of one or more selected NAND strings, selected by the corresponding string select lines for string select switches coupled to the first bit line BL(1). The coefficient W2 can be represented by the conductivity of one or more selected NAND strings, selected by the corresponding string select lines for string select switches coupled to the second bit line BL(2).

The conductivity of the selected NAND strings is determined by the data stored in the memory cells at a selected level of the NAND block. In the illustration, the NAND strings at the level of word line WL1 are selected. Thus, as illustrated, the first coefficient W1 of the product term W1*X1 corresponds to the combination of coefficient values w(1-1):w(1-S), in the case that all S string select lines are driven to connect their corresponding NAND strings to the first bit line BL(1). The second coefficient W2 of the product term W2*X2 corresponds to the combination of coefficient values w(2-1):w(2-S), in the case that all S string select lines are driven to connect their corresponding NAND strings to the second bit line BL(2).

In the computation mode of operation described herein, a signal OUTPUT Y1 produced as a result of a sum-of-products operation of the NAND block is provided on the source line SL1 for the block. In the example illustrated in FIG. 2, including two bit lines and two columns of NAND strings in the array of NAND strings, along with N string select lines and N rows of NAND strings in the array of NAND strings, output OUTPUT Y1 is a current accumulated by the current paths 290 corresponding to the sum-of-currents in the NAND strings in the NAND block.

As illustrated, the current path 290 includes the current on the bit line BL(1) through the NAND string 200 to the source line SL1, plus the current on bit line BL(1) through the NAND string 201 to the source line SL1, plus the current on bit line BL2 through the NAND string 202 to the source line SL1, plus the current on bit line BL2 through the NAND string 203 to the source line SL1.

This current accumulated from the paths 290 corresponds to the sum-of-products terms, W1*X1 and W2*X2. The coefficient W1 is a function of the data values w(1-1):w(1-S) in the column of memory cells coupled to word line WL1 and bit line BL(1), and the coefficient W2 is a function of the data values w(2-1):w(2-S) in the column of memory cells coupled to word line WL2 and bit line BL(2). Using S memory cells in each column of memory cells coupled to a given bit line to represent a coefficient of a product term enables use of high precision data (e.g., having multiple significant digits) to represent the coefficient. By controlling the number of rows selected by string select lines simultaneously during a computation mode operation, and thereby the number of memory cells used to represent the coefficient, the precision of the coefficient can be varied as suits the needs of a particular implementation. Thus, for a block including a number S of string select lines, a single coefficient, if an input data value is represented by a voltage on a single bit line, can be represented by data stored in a number of memory cells ranging from 1 to S.

The current produced in a single NAND string in a NAND block as described herein, during a computation mode operation can be relatively small. Therefore, the combination of currents from all of the NAND strings in an array of NAND strings of the NAND block can remain within a range of current values efficiently sensed using a current sensing sense amplifier coupled to the source line SL1 for the block.

A NAND block as described herein can be implemented using a 3D NAND memory technology. Some examples, among a variety of alternatives known in the art, of NAND blocks including vertical NAND strings are described in U.S. Pat. No. 9,698,156, entitled VERTICAL THIN CHANNEL MEMORY, by Lue, issued 4 Jul. 2017; and U.S. Pat. No. 9,524,980, entitled U-SHAPED VERTICAL THIN CHANNEL MEMORY, by Lue, issued 20 Dec. 2016; and such patents are incorporated by reference as if fully set forth herein. Implementations can also be made using 2D NAND technology, in which the NAND block is logically defined across the plurality of 2D NAND arrays.

Figure 3:
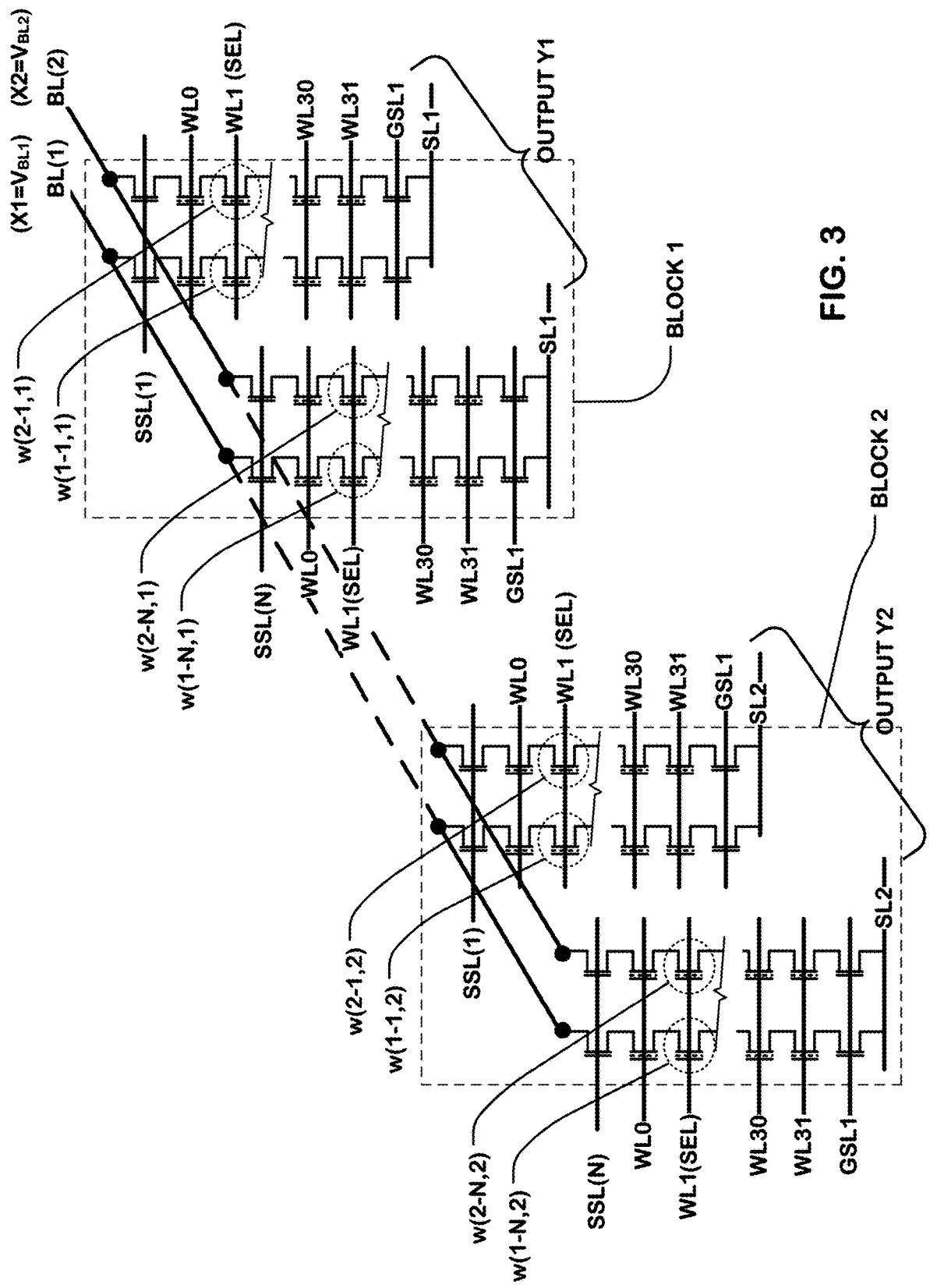
FIG. 3 is a circuit diagram illustrating a plurality of NAND blocks like that of FIG. 2.

FIG. 3 is a schematic diagram illustrating one example in which a circuit including a plurality of NAND blocks like that of FIG. 1 can be interconnected into a single array of NAND blocks, as a sum-of-products accelerator for the purposes of large-scale sum-of-products computations usable for neural networks. In FIG. 3, block 1 is implemented in the manner described above with respect to FIG. 2. Likewise block 2 is implemented in the same manner. The blocks share bit lines. Thus, bit line BL(1) is coupled to a first column of NAND strings in the array of NAND strings of block 1, and to a first column of NAND strings in the array of NAND strings in block 2. Likewise, bit line BL(2) is coupled to a second column of NAND strings in the array of NAND strings of block 1, and to a second column of NAND strings in the array of NAND strings in the block 2. The NAND blocks can be operated in sequence for the purposes of sum-of-products computations. Thus, the inputs X1 and X2 on bit lines BL(1) and BL(2) can be used for a sum-of-products operation using block 1, as enabled by the string select lines and ground select lines. Subsequently, the inputs X1 and X2 on bit lines BL(1) and BL(2) can be used for a sum-of-products operation using block 2. The word lines can be separately operated and decoded for each block.

In the example illustrated, the coefficient W1 stored in block 1 is represented by the data values stored in memory cells in a column of NAND strings at a selected level of the block. Thus, in block 1, for a selected level at the level of word line WL1, the coefficient W1 in block 1, bit line BL(1) and string select lines SSL(1):SSL(N) corresponds to a combination of the data values w(1-1,1):w(1-N,1). Likewise, for a selected level at the level of word line WL1, the coefficient W2 in block 1, bit line BL(2) and string select lines SSL(1):SSL(N) corresponds to a combination of the data values w(2-1,1):w(2-N,1). In block 2, for a selected level at the level of word line WL1, the coefficient W1 in block 2, bit line BL(1) and string select lines SSL(1):SSL(N) corresponds to a combination of the data values w(1-1,2):w(1-N,2). Likewise, for a selected level at the level of word line WL1, the coefficient W2 in block 2, bit line BL(2) and string select lines SSL(1):SSL(N) corresponds to a combination of the data values w(2-1,2):w(2-N,2).

The pattern of NAND blocks illustrated in FIG. 3 can be repeated along the bit lines for any practical number of NAND blocks, and along the word lines for any practical number of NAND blocks. In this manner, a circuit comprising a large number of NAND blocks can be implemented for the purposes of large-scale computation of sum of products operations.

Figure 4:
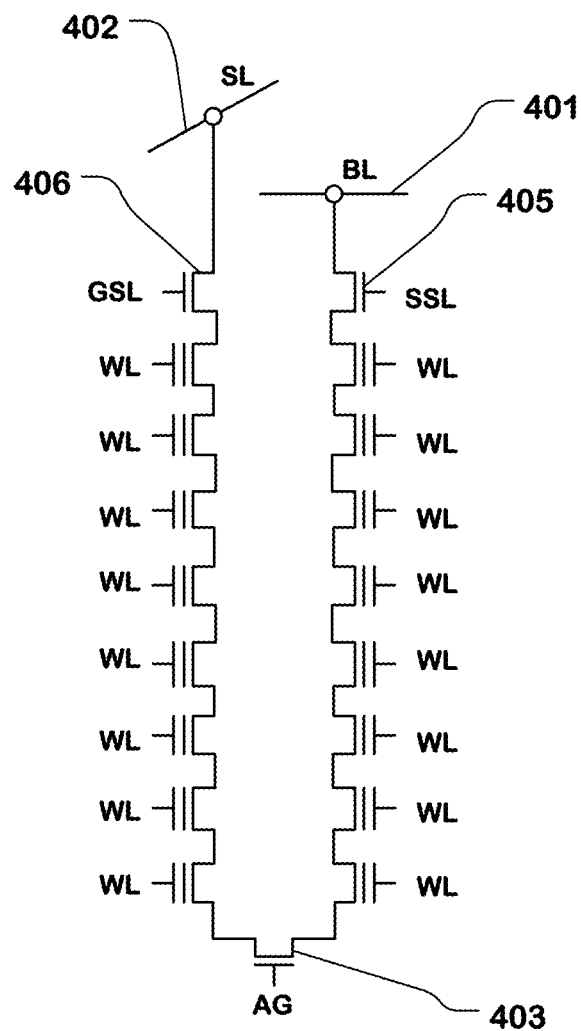
FIG. 4 illustrates an alternative NAND string implementation suitable for use in NAND blocks as described herein.

FIG. 4 illustrates an alternative NAND string configuration that can be utilized in a NAND block as described herein. In FIGS. 2 and 3, the NAND strings are straight NAND strings, with string select gates coupled to bit lines at the top of the NAND string, and ground select gates coupled to the source line at the bottom of the NAND string. In the alternative illustrated in FIG. 4, a U-shaped NAND string is shown. Using a U-shaped NAND string, the source line and the bit lines can be routed above the 3D block of NAND strings. Thus, as shown in FIG. 4, a bit line 401 is coupled by a string select switch 405 to a first side of the U-shaped NAND string. An assist gate 403 at the bottom of the first side of the U-shaped NAND string is coupled to a second side of the U-shaped NAND string. At the top of the second side of the U-shaped NAND string, a ground select switch 406 connects the NAND string to the source line 402. The bit lines and the source line can be routed on different layers of patterned metal on the integrated circuit.

Figure 5:
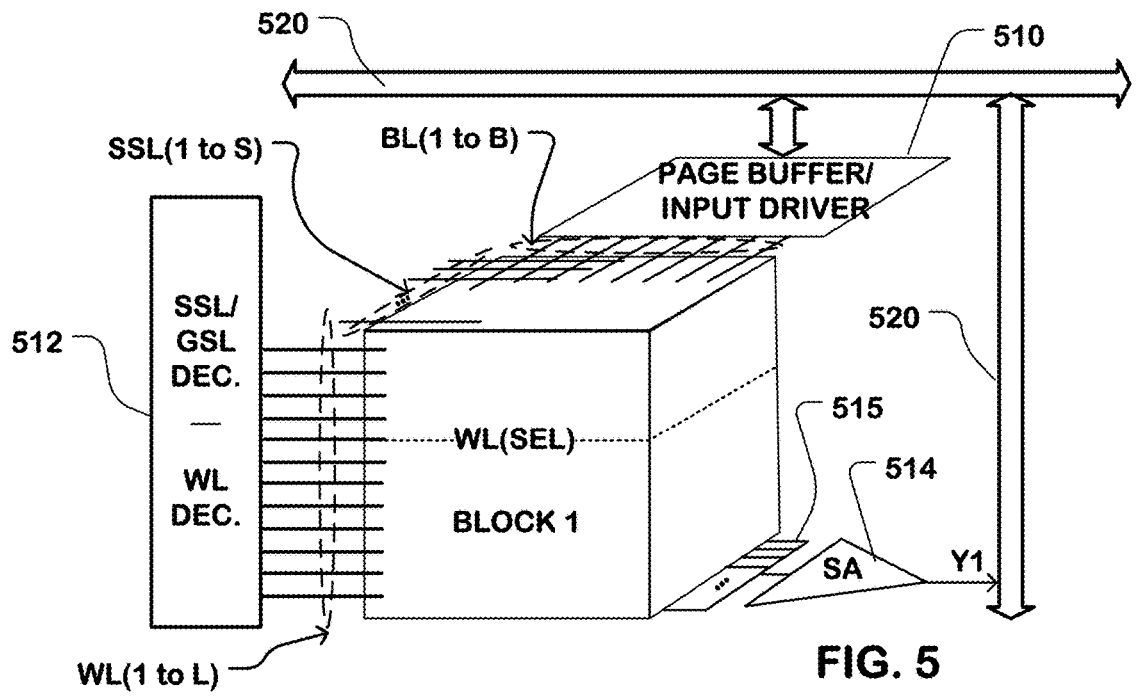
FIG. 5 is a simplified illustration of a NAND block as described herein.

FIG. 5 is a conceptual illustration of a NAND block configured as described herein. A NAND block BLOCK 1 comprising a plurality of vertical NAND strings like that shown in FIG. 1 is represented. The depth of the NAND block in levels of memory cells corresponds to the number L of word line levels WL(1:L). The number of columns of NAND strings in the NAND block corresponds to the number B of bit lines BL(1:B). The number of rows of NAND strings in the NAND block corresponds to the number S of string select lines SSL(1:S).

A page buffer and input driver 510 is coupled to the plurality of bit lines BL(1:B). The page buffer includes bit line drivers coupled to bit lines in the plurality of bit lines, and sense amplifiers coupled to bit lines in the plurality of bit lines. The page buffer/input driver 510 is used in the memory mode for holding data used for writing coefficients into the block. In the memory mode, the page buffer is used for the purposes of applying bit line voltages during the program and erase operations, for example, in a NAND flash array. In the computation mode, the input driver is used to apply bit line voltages corresponding to input data of the sum-of-products operations. In some embodiments, the page buffer can be utilized in the computation mode as a means for defining a data pattern of the input data values. In other embodiments, the input data values can be applied to the input drivers using an alternative memory path and decoder. Likewise, the input driver used in the computation mode can be included in the bit line driver in the page buffer used in the memory mode in some embodiments. In other embodiments, the bit line driver for the memory mode is different than the input driver for the computation mode.

A word line and string select line/ground select line decoder 512 is coupled to the plurality of word lines and to the plurality of string select lines and ground select lines of the NAND block. The decoder 512 is operable to select one, or more than one, of the plurality of string select lines for connection of NAND strings to corresponding bit lines. Also, the decoder 512 is operable to select a level of memory cells by driving a selected word line WL(SEL) at a particular level of the block. In the memory mode, the decoder 512 typically selects one string select line and one word line for a page read or page write operation. In the computation mode, the decoder 512 selects a plurality of string select lines including all of the string select lines, and one word line for a sum-of-products operation to produce a current on the source line 515 corresponding to the sum of the conductances of the selected NAND strings in the array.

The source line 515 is coupled to a sense amplifier 514, which converts the current on the source line 515 to a digital output value Y1. The sense amplifier 514 can be disabled during the memory mode. The page buffer/input driver 510 and the sense amplifier 514 can be coupled to a data bus system 520 for routing the input and output data among the NAND blocks for a large scale sum-of-products operation. A sequencing controller, not shown, can be used to coordinate operation of the decoders 512, the page buffer/input driver 510, and the sense amplifier 514, for the memory mode operation and for the computation mode operations.

Figure 6:
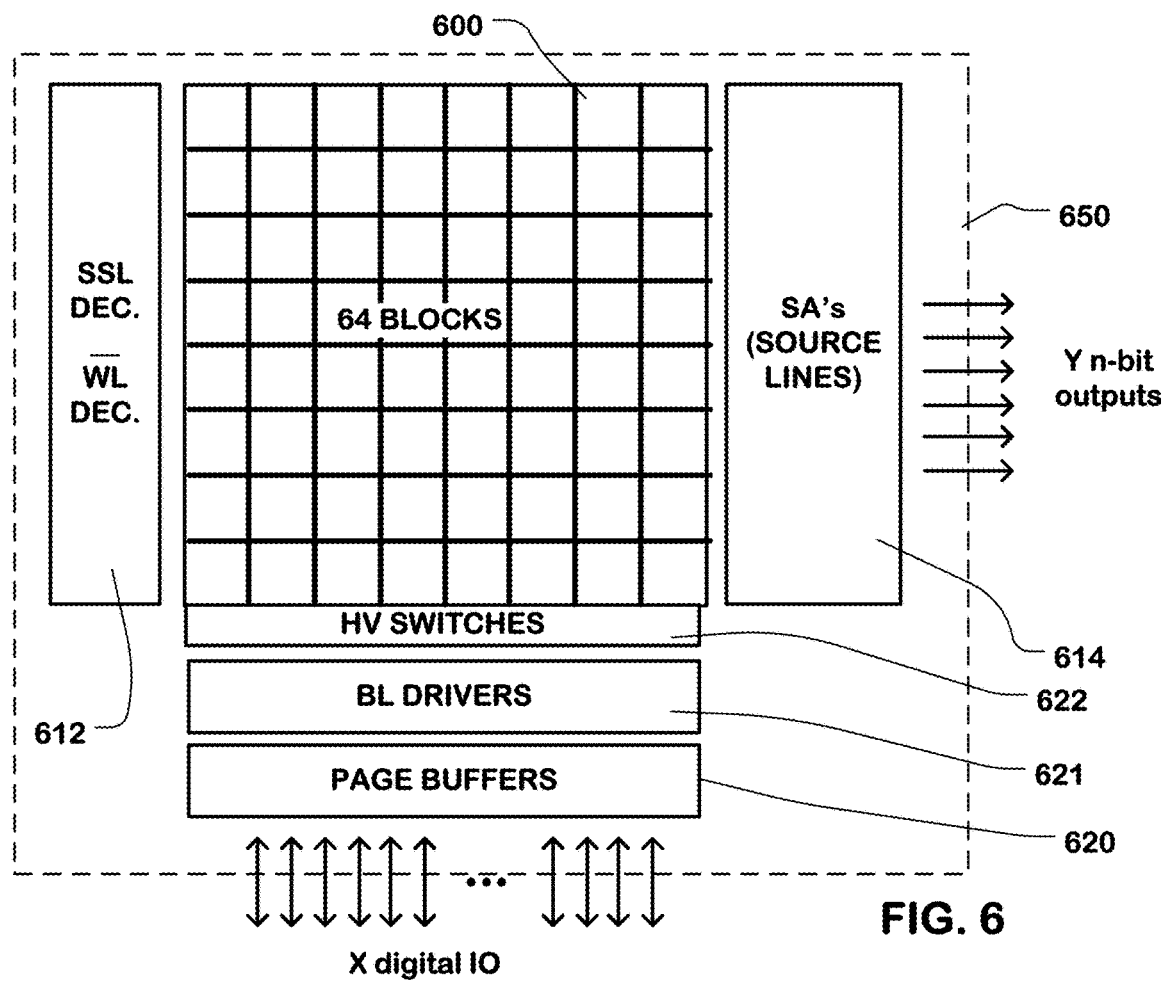
FIG. 6 illustrates an integrated circuit comprising a plurality of NAND blocks, having a memory mode and a computation mode.

These elements 510, 512, and 514 and the various embodiments described herein, comprise a means for applying input signals to a multi-member set of bit lines in the plurality of bit lines coupled to a NAND block in the plurality of NAND blocks, for connecting sets of NAND strings in the NAND block to respective bit lines in the set of bit lines, and for sensing a sum-of-currents from the set of bit lines through the respective sets of NAND strings FIG. 5 illustrates a single NAND block. FIG. 6 is a block diagram of a circuit tile 650 that comprises an array 600 of NAND blocks. In this example, the array 600 of NAND blocks includes 64 blocks in an 8×8 array. Word line and string select line decoders 612 are disposed in the tile. The word line decoders and word lines for the individual blocks can be independently controlled. Also, the string select decoders and string select lines for the individual blocks can be implemented as separate circuits, and can be independently controlled.

In some embodiments, the word line decoders and word lines, and the string select line decoders and string select lines, can be arranged in horizontal lanes such that some or all of the NAND blocks in a horizontal lane shares the same word line conductors and word line decoders, and the same string select lines and string select line decoders. In this 8×8 array, there can be 8 horizontal lanes of NAND blocks, for example.

The bit lines of the tile are coupled to a set of circuits like those used in large-scale NAND memory devices. The set of circuits includes high voltage switches 622 coupled to the bit lines for use supporting program and erase operations on the bit lines. Also, the set of circuits includes bit line input drivers 621 for logic inputs during the computation mode which are arranged to apply voltages to the bit lines, including bit line voltages corresponding to the input values of a sum-of-products operation. The set of circuits also includes page buffers 620 used to define a set of data for a program operation, used to store data during program verify operations, and used in the read operations for transfer of data out of the memory array. Also, the page buffers 620 can be utilized to as part of the logic path to select voltage levels to be applied during the computation mode on the plurality of bit lines of a given sum-of-products operation.

The page buffers 620, bit line input drivers 621, and high voltage switches 622 can be arranged in a plurality of vertical lanes, such that all of the NAND blocks in a vertical lane share the same bit lines, and associated circuitry. In one example implementation, the array 600 of NAND blocks can comprise 8K bit lines, configured into eight 1K lanes of bit lines, coupled to a column of eight NAND blocks in this example.

Sense amplifiers 614 are coupled to the array 600 of NAND blocks. There can be for example 64 current sensing sense amplifiers, each coupled to one of the 64 NAND blocks in the plurality of NAND blocks of the array 600. In other embodiments, the set of sense amplifiers 614 can include one sense amplifier for each horizontal lane of the array 600. In other embodiments, the set of sense amplifiers 614 can include one sense amplifier for each vertical lane.

As illustrated in FIG. 6, data paths (X digital IO) carrying digital input/output data are coupled to the page buffers 620 and bit line input drivers 621, and can be connected to a data bus system or input/output IO circuitry on an integrated circuit on which the tile is implemented. Likewise, data paths carrying digital outputs (Y n-bit outputs) from the sense amplifiers 614 can be connected to a data bus system, or I/O circuitry on the integrated circuit on which the tile is implemented.

Figure 7:
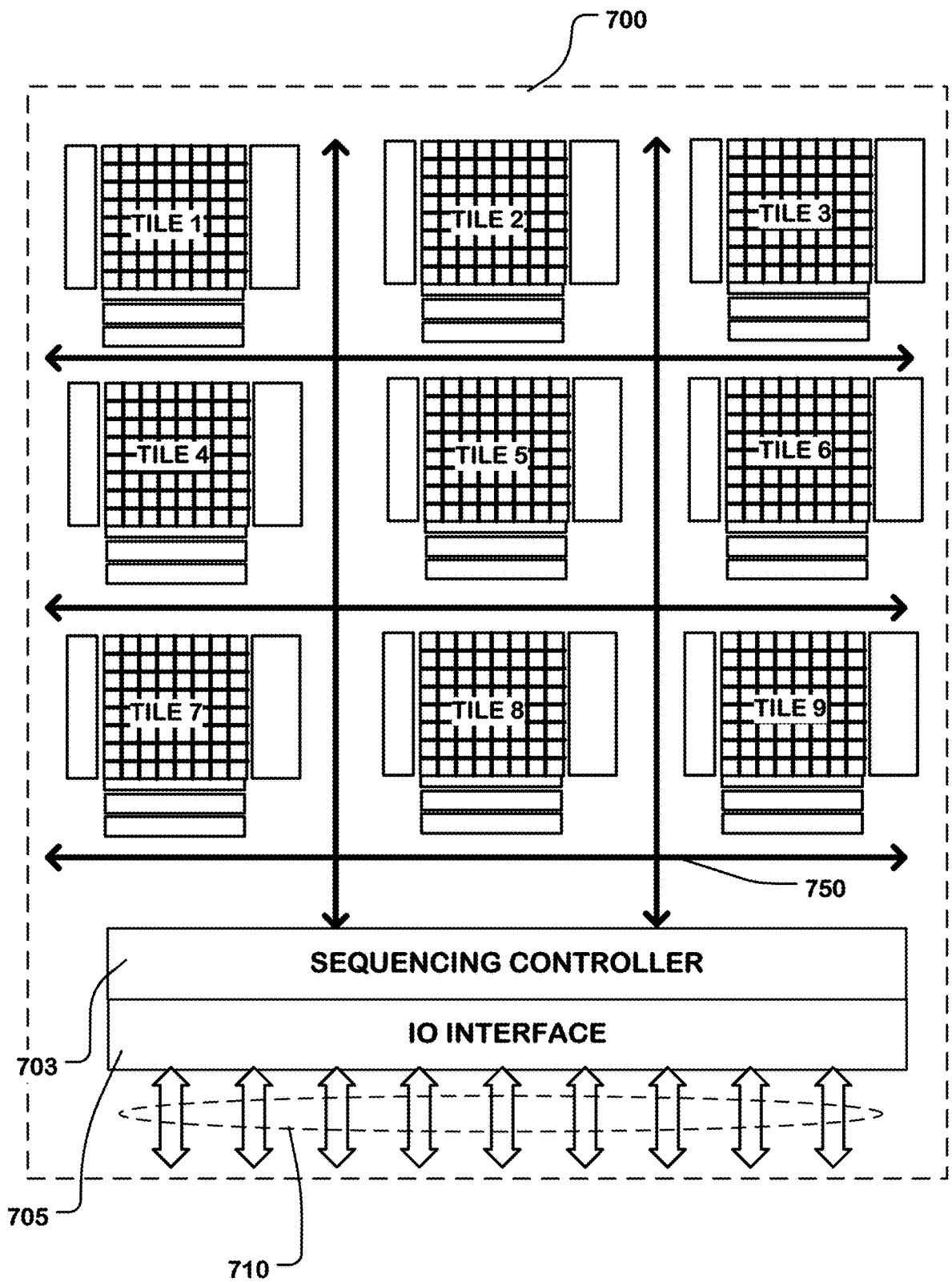
FIG. 7 illustrates a large scale integrated circuit including a plurality of tiles, each tile comprising a NAND block array as described herein.

FIG. 7 illustrates an embodiment including a plurality of tiles like that shown in FIG. 6. Thus, integrated circuit 700 is illustrated including tiles TILE 1 through TILE 9 arranged in the 3×3 grid. An inter-tile bus system 750 on the integrated circuit 700 is coupled to the data paths on the plurality of multiply-and-accumulate accelerator tiles. A sequencing controller 703 is coupled to the grid of tiles via the bus system 750 for controlling data flow among the plurality of tiles, and for configuring operations of the tiles using command sequences, for example, for memory mode operations and computation mode operations delivered by the bus system 750. An input/output interface 705 is coupled to the sequencing controller 703 which can include a plurality of input interfaces 710, including for example, high-capacity DDR DRAM interfaces, high-capacity serial interfaces, high-capacity PCIe interfaces, and other industry standard or custom interfaces for moving high quantities of data into and out of the grid.

Figure 8:
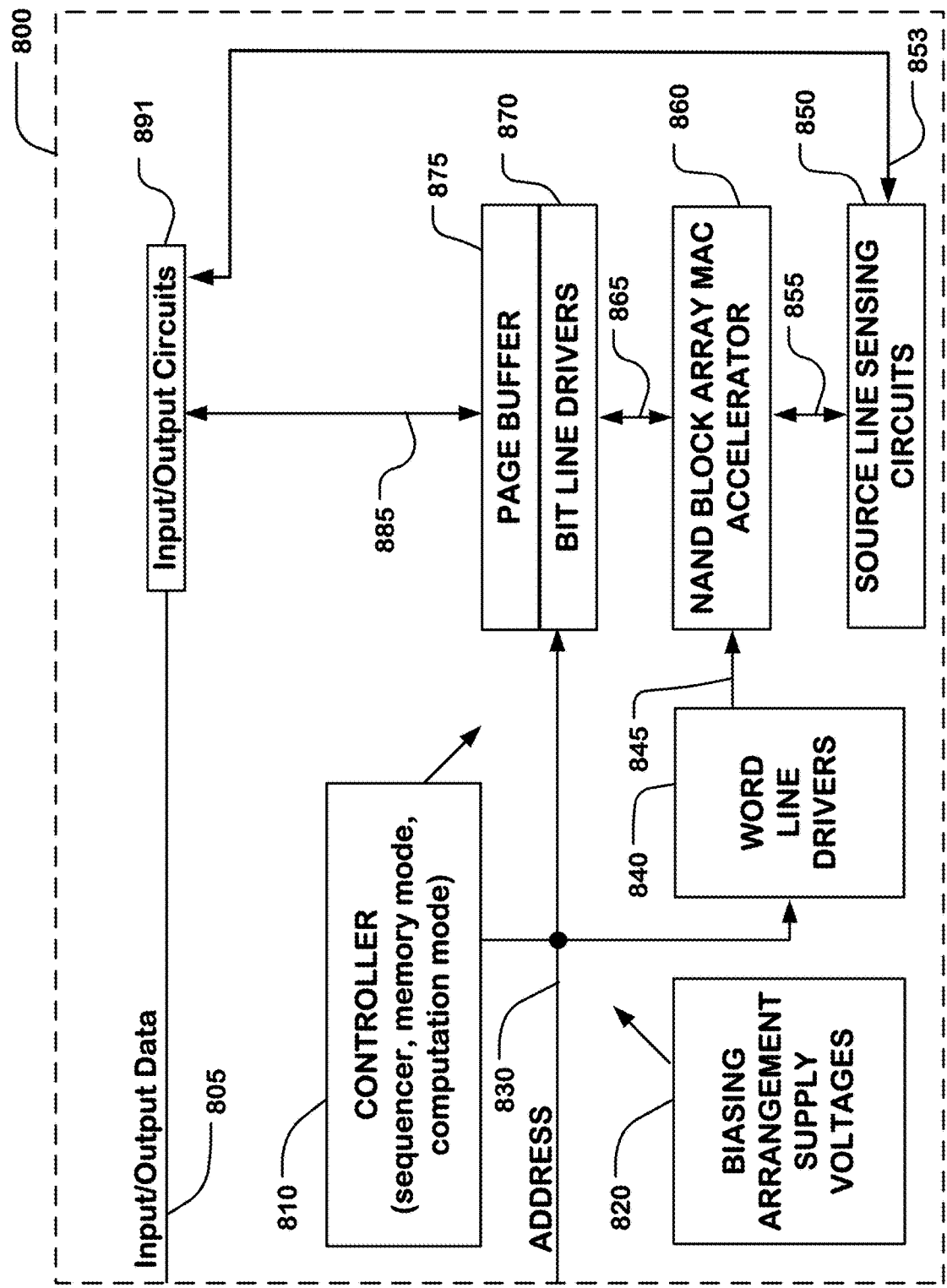
FIG. 8 is a simplified block diagram of an integrated circuit comprising a NAND block array MAC accelerator.
Figure 9:
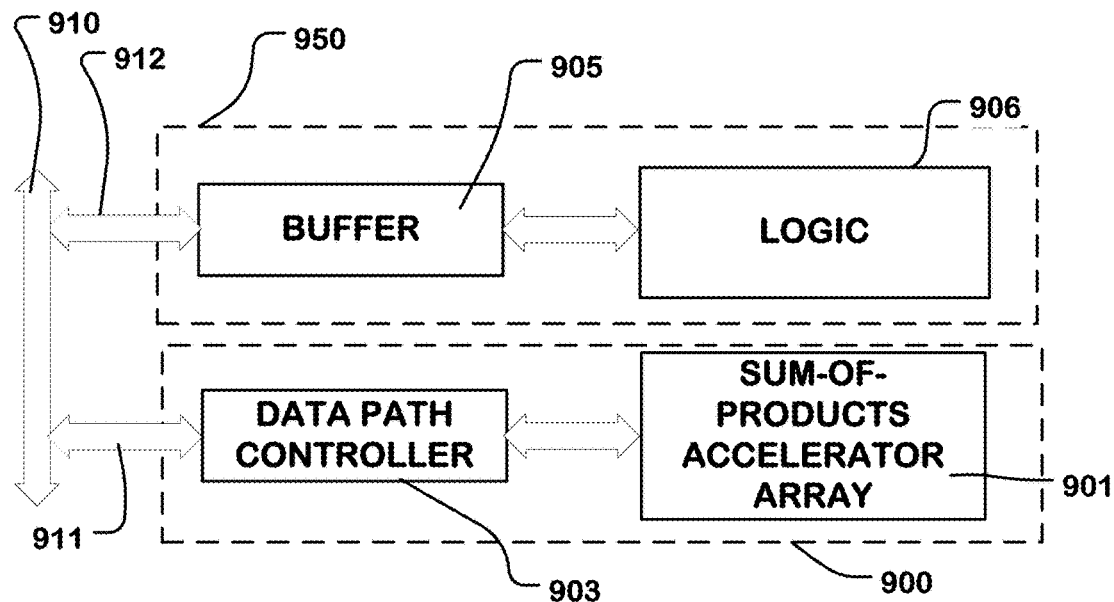
FIG. 9 is an illustration of a configuration of a system including a sum-of-products accelerator array which can comprise a NAND block array as described herein.

FIG. 8 is a simplified chip block diagram of another embodiment of an integrated circuit device 800 including a MAC accelerator memory array comprising a NAND block array 860 of flash memory cells, implemented for example, as shown in FIG. 2, in various embodiments such as illustrated in FIG. 6 and FIG. 9. The device 800 in this example includes a controller 810, that includes state machines for example for memory operations in a memory mode and MAC accelerator or sum-of-products operations in a computation mode as discussed above. Also, the controller 810 in this example includes a sequencer for controlling use of the device 800 in large scale AI functions involving the NAND block array 860, and data flow operations inside and outside of the device.

The integrated circuit device 800 includes a set of source lines 855 coupled to corresponding NAND blocks in the array 860, and a set of bit lines 865 coupled to corresponding NAND blocks in the array 860.

A set of word lines is coupled to gates of the memory cells at corresponding levels of the NAND blocks, signals on the word lines in the set of word lines selecting respective levels of memory cells. Word line drivers 840 are coupled to a set of word lines 845.

A set of sensing circuits 850 is coupled to respective source lines in the set of source lines. For sum-of-products operations using the array, the source line sensing circuits 850 can sense current at source lines 855 from the memory array 860. Currents sensed at a particular source line in the set of source lines can represent a sum-of-products as discussed above. Sensed data from the source line sensing circuits 850 are supplied via data lines 853 to input/output circuits 891.

Bit line drivers in circuits 870 are coupled to page buffer 875, and to bit lines 865. For sum-of-products operations using the array, bit line drivers in circuits 870 can produce an input x(m) for each selected bit line.

Addresses are supplied on bus 830 from control logic (controller) 810 to page buffer 875, bit line drivers in circuits 870 and word line drivers 840. Page buffer 875, bit line drivers in circuits 870, and source line sensing circuits 850 are coupled to the input/output circuits 891 by lines 853, 885.

Input/output circuits 891 drive the data to destinations external to the integrated circuit device 800. Input/output data and control signals are moved via data bus 805 between the input/output circuits 891, the control logic 810 and input/output ports on the integrated circuit device 800 or other data sources internal or external to the integrated circuit device 800, such as a general purpose processor or special purpose application circuitry, or a combination of modules providing system-on-a-chip functionality supported by the memory array 860.

In the example shown in FIG. 8, control logic 810, using a bias arrangement state machine, controls the application of supply voltages generated or provided through the voltage supply or supplies in block 820, for sum-of-products operations in a computation mode and for read and write (program and erase) operations in a memory mode.

The control logic 810 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

Control logic 810 can also implement circuitry to support pipeline operations in a computation mode of the device. For example, the following table shows pipeline operations for three blocks with SRAM supported by logic to receive and operate on the outputs of the blocks.

| | 3D NAND circuit | | | Logic Circuit |
|---|---|---|---|---|
| Time | Block0 | Block1 | Block2 | (SRAM) |
| 1 | Sensing current and MAC operation | Pre-setup array WL and HV's for next MAC | Inactive | Wait received data |
| 2. | Data transfer to Logic circuit | Pre-setup array WL and HV's for next MAC | Inactive | Received data from block0 |
| 3 | Inactive | Sensing current and MAC operation | Pre-setup array WL and HV's for next MAC | CMOS logic operation for signal from block0 |
| 4 | Inactive | Data transfer to Logic circuit | Pre-setup array WL and HV's for next MAC | Received data from block1 |
| 5 | Inactive | inactive | Sensing current and MAC operation | CMOS logic operation for signal from block1 |
| 6 | Inactive | inactive | Data transfer to Logic circuit | Received data from block2 |

FIG. 9 illustrates a configuration of a system including a first integrated circuit 900 including a sum-of-products accelerator array 901 (or MAC accelerator) interconnected using a data path controller 903 by lines 911 to an external bus system 910. The sum-of-products accelerator array 901 can be implemented using an array of NAND blocks or an array of tiles of arrays of NAND blocks as discussed above. A second integrated circuit 950 acts as a controller, and includes a buffer 905 and supporting logic 906 for use in coordination with the sum-of-products accelerator array 901. The second integrated circuit 950 is coupled to the bus system 910 by lines 912. The buffer 905 in the second integrated circuit 950 can comprise an SRAM array, a DRAM array, a NOR flash array, or other type of memory that can be used in coordination with the sum-of-products accelerator array 901. The logic 906 can include sequencing logic for managing operation of the neural network. The logic 906 can also include activation function logic and other logic supporting the computation mode of the device. Also, the logic 906 can comprise a large scale processor forming digital sum-of-products operations and other operations supporting a large scale neural network.

The first integrated circuit 900 and second integrated circuit 950 can be mounted in a stacked chip configuration, in a multichip module or in other compact configurations, in some embodiments, in which the interconnect lines in the bus system 910, 911, 912 comprise inter-chip connections including for example through silicon vias, ball grid connections, and so on.

Figure 10:
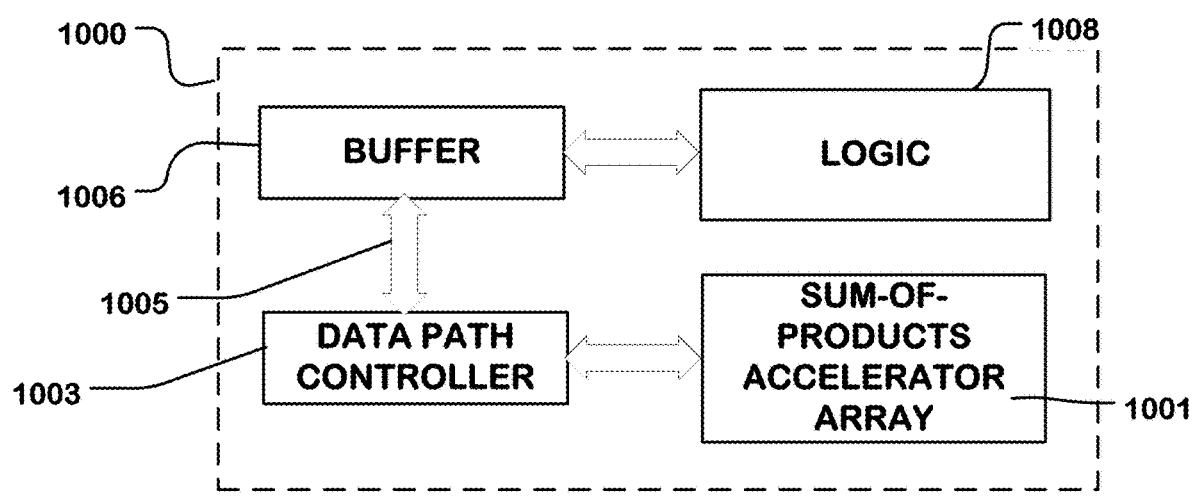
FIG. 10 is an illustration of an alternative configuration of a system including a sum-of-products accelerator array which can comprise a NAND block array as described herein.

FIG. 10 illustrates an alternative embodiment including a sum-of-products accelerator array 1001 with a controller on a single integrated circuit 1000. In this example, data path controller 1003 is implemented on the integrated circuit with the sum-of-products accelerator array 1001. A data path 1005 couples the data path controller to a buffer 1006, which is in turn coupled to logic 1008 on the same integrated circuit 1000. As represented in FIG. 10, data from the buffer 1006 can be transferred to the sum-of-products accelerator array 1001, using a direct data path that can be controlled using the data path controller 1003.

Figure 11:
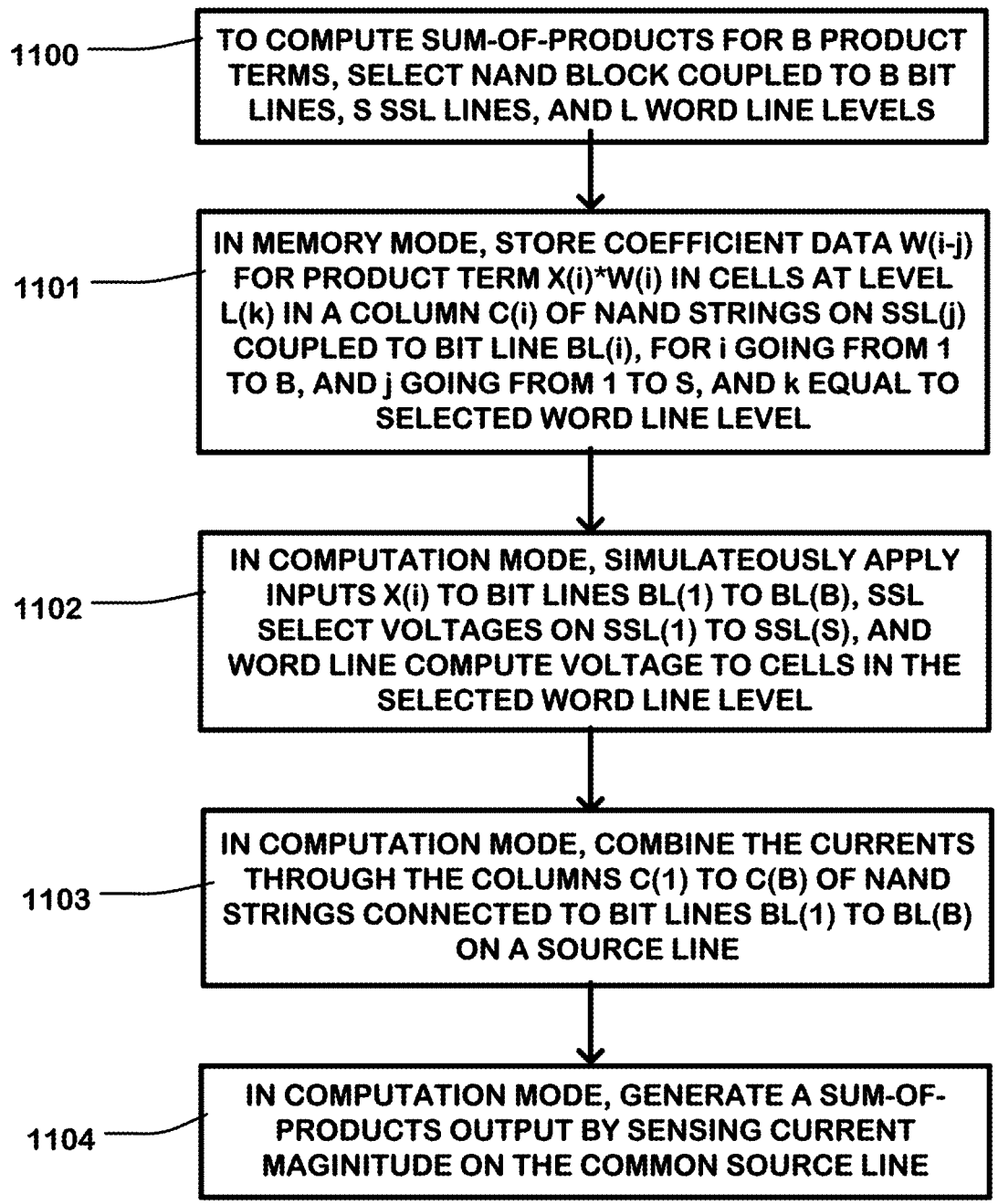
FIG. 11 is a flow chart of a method for in-memory multiply-and-accumulate operations as described herein.

FIG. 11 is a flowchart illustrating a method for computing a sum-of-products using a NAND block as described herein. The control logic 810 in the example of FIG. 8 can include a state machine supporting this method. The method of FIG. 11 is applied to a single NAND block. The method can be extended to an array of NAND blocks, and an array of tiles as discussed above, to support large scale multiply-and-accumulate operations.

Thus, to compute a sum-of-products for a number B of product terms, the method includes selecting a NAND block coupled to B bit lines, a number S string select lines, and having a number L of word line levels (1100). To set up the computation, operating the NAND block in a memory mode, the method includes storing coefficient data w(i-j) for the product term $W(i)*X(i)$ in a set of memory cells at a level $L(k)$ of a column $C(i)$ of NAND strings on a string select line $SSL(j)$ coupled to bit line $BL(i)$, for the index i of bit lines going from 1 to B, and the index j of SSL lines going from 1 to S, the index k for the word line levels being held at a constant selected level. Using a NAND page programming operation, the coefficient data can be stored in the memory cells on NAND strings coupled to a single SSL line $SSL(i)$. The NAND page programming operation is repeated for each of the SSL lines in the set of SSL lines $SSL(1)$ to $SSL(S)$ (1101).

In this manner, the coefficient $W(i)$ is represented by the number S of data values (w(i-j) for j going from 1 to S) stored in the set of memory cells at a word line level k in the column $C(i)$ of NAND strings coupled to the string select switches on string select lines $SSL(1)$ to $(S)$.

In general, the number S can be equal to the physical number of string select lines. In some embodiments, the number S used to store particular coefficient can be any number from 1 up to the maximum physical number of string select lines. Likewise, the number B of bit lines corresponds to the number of product terms to be summed in the NAND block. The number B can be equal to the maximum physical number of bit lines coupled to the block, or to a number of bit lines selected for a particular number of product terms.

Once the data is stored, the device can enter a computation mode. In the computation mode the inputs X(i) represented by bit line voltages VBLi are applied to the bit lines BL(i) in parallel, for i going from 1 to B, and can be simultaneously applied to the bit lines. Also, string select line select voltages, which are set to turn on the string select switches connecting the bit line to the corresponding NAND strings, are simultaneously applied to all of the string select lines SSL(j) in parallel, for j going from 1 to S. Also, word line voltages are applied to the word line or word lines in the word line level k corresponding to the particular product term be computed (1102).

This has the effect of connecting a number S of NAND strings to each of the bit lines BL(i) in parallel, and applying a computation level word line voltage to the word line or word lines at the selected word line level k. At the same time the ground select lines are set to a select voltage level to turn on the ground select switches connecting the NAND strings to the source line. The data value in the cells at the selected word line level has the effect of setting the conductances of the NAND strings according to the coefficients stored.

Also, in the computation mode, the currents through the number S of NAND strings in columns C(1) to C(B) of NAND strings connected to the bit lines BL(1) to BL(B) are combined on the source line for the NAND block (1103).

As a result, the current on the source line corresponds to the sum of the B product terms being computed.

Finally in the computation mode, a sum-of-products output is generated by sensing the current magnitude on the source line (1104). This output can be a multibit digital output that is delivered to a bus system for routing according to the sequence of computations being executed.

The flowchart illustrates logic executed by a memory controller or by a memory device as described herein. The logic can be implemented using processors programmed using computer programs stored in memory accessible to the computer systems and executable by the processors, by dedicated logic hardware, including field programmable integrated circuits, and by combinations of dedicated logic hardware and computer programs. It will be appreciated that many of the steps can be combined, performed in parallel, or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow chart shows only steps that are pertinent to an understanding of the technology, and it will be understood that numerous additional steps for accomplishing other functions can be performed before, after and between those shown.

In general, a high performance, low power multiply-and-accumulate accelerator circuit has been described. Implementations of the accelerator circuit can comprise 3D NAND flash blocks arranged for high capacity computation of sum-of-products operations. Utilizing the structures described herein, the current magnitudes required for sum-of-products computations can be very small and tightly controlled. In embodiments described herein, thousands and tens of thousands of cells can be operated together to support high throughput, low power sum-of-products operations.

In examples described herein, each block has a separated source line which can collect current from many NAND strings on a plurality of bit lines and string select lines simultaneously. The current on the source line can be coupled to a current sensing sense amplifier having a wide dynamic range, with an average current per block ranging from 10 µA to 100 µA average, having multi-bit sensing (2 bits, 3 bits, 4 bits for example.) The per-string current can be trimmed by setting appropriate threshold voltages and driving voltages to be a small as possible, such as in the range of less than 50 nanoAmperes per string, enabling sensing of 1000 to 10,000 strings in parallel in a single sense amplifier. For example, the word lines can be biased close to the middle between a program verify an erase state of a flash memory cell, and the bit line voltages can be reduced to levels below 0.3 V to make small per-string current.

The number of bit lines used for input in parallel to a NAND block and string select lines used for the purposes of storing the coefficients can be set as desired for a particular implementation. Also, the number of bit lines and string select lines used for a given computation can be logically determined in each cycle of the operation.

Because of the use of multiple string select lines, and thereby multiple NAND strings coupled to a single bit line in parallel, the coefficients or weights of each product term can be distributed into multiple memory cells in the NAND block. This enables high resolution of the coefficients, or effectively analog weight values, since each of the cells can be individually trimmed to a high accuracy using NAND flash programming operations. As a result, the reliability of the computations can be very high.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A circuit comprising:
a plurality of NAND blocks with corresponding block source lines, a particular NAND block in the plurality of NAND blocks including a block of NAND strings disposed between a multi-member set of bit lines and the corresponding block source line of the particular block; and
an input circuit to apply at least two different input signals to the multi-member set of bit lines coupled to the plurality of NAND blocks; and
current sensing circuits coupled to the block source lines, the current sensing circuits sensing a sum-of-currents, from multiple NAND strings, on the block source line in a selected NAND block from the set of bit lines through the block of NAND strings in the selected NAND block and producing an output derived from the current on the block source line, the current sensing circuits comprising at least one current sense amplifier connected directly to the block source line.

2. The circuit of claim 1, including a plurality of bit lines coupled to the plurality of NAND blocks including said multi-member set of bit lines, and wherein the input circuit comprises page buffers coupled to bit lines in the plurality of bit lines.

3. The circuit of claim 2, including means for programming NAND strings coupled to respective bit lines in the plurality of bit lines.

4. The circuit of claim 1, wherein a NAND block in the plurality of NAND blocks includes:
a plurality of NAND strings between its multi-member set of bit lines and its block source line, the NAND strings having string select switches to selectively connect the NAND strings to corresponding bit lines in its multi-member set of bit lines, and a plurality of memory cells arranged in series, wherein bit lines in its multi-member set of bit lines are coupled to respective sets of NAND strings in the plurality of NAND strings;
word lines coupled to gates of memory cells in corresponding word line levels of the NAND block; and
string select lines coupled to gates of string select switches in corresponding rows of NAND strings in the plurality of NAND strings.

5. The circuit of claim 4 wherein, for the NAND block, the multi-member set of bit lines includes B members, and the NAND block includes a set of string select lines having at least S members, and wherein string select drivers are operable to connect S NAND strings in a column of the NAND block to each bit line in the multi-member set of bit line so that current on the source line of the NAND block is a sum of B product terms, where each product term is a function of an input signal on one of the bit lines in the set of bit lines times conductance of the S NAND strings connected to the one bit line.

6. The circuit of claim 1, wherein the input circuit includes a set of bit line drivers to apply input data in parallel to bit lines of the selected NAND block, and the sensing circuits include a multibit sense amplifier to sense output data on a corresponding source line.

7. The circuit of claim 1, wherein each NAND block in the plurality of NAND blocks having a computation mode input and output, and each having a memory mode input and output; and including:
a bus system connected to the computation mode inputs and outputs, and to the memory mode inputs and outputs of the plurality of NAND blocks.

8. The circuit of claim 7, wherein the memory mode input of a given NAND block in the plurality of NAND blocks includes a page buffer circuit to read and write data via bit lines of the given NAND block.

9. The circuit of claim 1, where blocks in the plurality of NAND blocks each include B*S NAND strings including B columns and S rows of NAND strings, and L levels of memory cells, wherein B, S and L are integers the NAND strings including L memory cells in series in respective levels of the L levels;
a set of (S) NAND strings in respective columns in the B columns coupled to corresponding bit lines in a set of B bit lines;
string select switches in a set of (B) NAND strings in respective rows in the S rows coupled to a corresponding string select line in a set of S string select lines;
a set of (B*S) memory cells in respective levels in the L levels operatively coupled to a corresponding word line or word lines in the L levels; and
a source line operatively coupled to the B*S NAND strings in the block.

10. The circuit of claim 1, including a controller to operate the plurality of NAND blocks in a pipeline fashion.

11. The circuit of claim 1, wherein the at least one current sense amplifier converts the current on the block source line to a digital output value.

12. A circuit, comprising:
a block of NAND strings, including B columns and S rows of NAND strings, and L levels of memory cells, wherein B, S and L are integers, the NAND strings including L memory cells in series in respective levels of the L levels;
B bit lines coupled to S NAND strings in respective columns in the B columns; S string select lines coupled to B NAND strings in respective rows in the S rows;
W word lines operatively coupled to (B*S) memory cells in respective levels in the L levels;
a block source line operatively coupled to the NAND strings in the block;
string select line drivers coupled to the S string select lines to supply string select voltages to connect NAND strings on multiple string select lines to corresponding bit line simultaneously;
word line drivers coupled to apply word line voltages to a word line or word lines in a selected level;
a plurality of bit line drivers coupled to bit lines in the B bit lines to apply at least two different input data signals to a plurality of the B bit lines; and
a current sensing circuit coupled to the block source line, the current sensing circuit comprising at least one current sense amplifier connected directly to the block source line, and producing an output derived from the current on the block source line.

13. The circuit of claim 12, including a page buffer operatively coupled to bit lines in the B bit lines to apply input data signals to program the NAND strings in the block in a program mode.

14. The circuit of claim 12, wherein the at least one current sense amplifier converts the current on the block source line to a digital output value.

15. A method for in-memory computation of a sum-of-products, comprising:
in a NAND block comprising B bit lines (BLs), S string select lines (SSLs), and one source line output,
storing coefficient data w(i,j) for a product term X(i)*W(i) in cells on a level L(k) of the NAND block in a column C(i) of NAND strings on string select lines SSL(j) coupled to bit line BL(i), for I going from 1 to B, for j going from 1 to S and for k equal to a selected word line level:
simultaneously applying inputs X(i) to bit lines BL(1) to BL(B), and string select voltages to string select lines SSL(1) to SSL(S), and a word line compute voltage to cells in the selected word line level;
combining currents through the columns C(1) to C(B) of NAND strings connected to bit lines BL(1) to BL(B) on the source line for the NAND block; and
sensing a current magnitude on the source line for the NAND block using a current sense amplifier connected directly to the source line for the NAND block to generate an output signal representing the sum-of-products; and
delivering the sum-of-products output signal from the current sense amplifier to an inter-tile bus system for routing among tiles comprising NAND blocks.

16. The method for in-memory computation of a sum-of-products of claim 15, wherein the output signal is a digital output signal.

17. A circuit comprising:
three or more multiply-and-accumulate accelerator tiles in an integrated circuit, each tile comprising:
a plurality of NAND blocks, each NAND block having inputs and outputs;
input data paths connected to the NAND block inputs;
output data paths connected to the NAND block outputs;
a plurality of bit lines coupled to the plurality of NAND blocks, and a plurality of block source lines coupled to the plurality of NAND blocks;
input drivers coupled to at least some of the bit lines in the plurality of bit lines;
current sense amplifiers coupled to at least some of the source lines in the plurality of source lines; and
page buffers coupled to at least some of the bit lines in the plurality of bit lines;
an inter-tile bus system on the integrated circuit coupled to the input and output data paths of the three or more multiply-and-accumulate accelerator tiles, wherein the inter-tile bus system is configured to control data flows among the tiles; and
input/output circuits on the integrated circuit coupled to the inter-tile bus system.

18. The circuit of claim 17, including sequencer logic for controlling data flow among the tiles.

19. The circuit of claim 17, wherein a multi-member set of bit lines in the plurality of bit lines is coupled to each NAND block in the plurality of NAND blocks, and wherein a NAND block in the plurality of NAND blocks includes:

a plurality of NAND strings between its multi-member set of bit lines and its source line, the NAND strings having string select cells to selectively connect the NAND strings to corresponding bit lines in its multi-member set of bit lines, and a plurality of memory cells arranged in series, wherein bit lines in its multi-member set of bit lines are coupled to respective sets of NAND strings in the plurality of NAND strings;

word lines coupled to gates of memory cells in corresponding word line levels of the NAND block; and string select lines coupled to gates of string select cells in corresponding rows of NAND strings in the plurality of NAND strings.

20. The circuit of claim 19, wherein, for the NAND block, the multi-member set of bit lines includes B members, and the NAND block includes a set of string select lines having at least S members, and wherein string select drivers are operable to connect S NAND strings in a column of the NAND block to each bit line in the multi-member set of bit lines, so that current on the source line is a sum of B products, where each product is a function of an input signal on one of the bit lines in the set of bit lines times conductance of the S NAND strings connected to the one bit line.

21. The circuit of claim 17, wherein the input of a given NAND block in the plurality of NAND blocks in each tile includes a set of bit line drivers to apply input data in parallel to bit lines of the given NAND block, and the output of the given NAND block in the plurality of NAND blocks includes a multibit sense amplifier to sense output data on a source line of the given NAND block.

22. The circuit of claim 17, wherein, for each tile, blocks in the plurality of NAND blocks each include B*S NAND strings including B columns and S rows of NAND strings, and L levels of memory cells, wherein B, S and L are integers, the NAND strings including L memory cells in series in respective levels of the L levels;

a set of (S) NAND strings in respective columns in the B columns coupled to corresponding bit lines in a set of B bit lines;

string select switches in a set of (B) NAND strings in respective rows in the S rows coupled to a corresponding string select line in a set of S string select lines;

a set of (B*S) memory cells in respective levels in the L levels operatively coupled to a corresponding word line or word lines in the L levels; and a source line operatively coupled to the B*S NAND strings in the block.

\* \* \* \* \*